United States Patent [19]

Skudera, Jr. et al.

[11] Patent Number: 5,257,284
[45] Date of Patent: Oct. 26, 1993

[54] CIRCUIT FOR ACCURATELY MEASURING PHASE RELATIONSHIP OF BPSK SIGNALS

[75] Inventors: William J. Skudera, Jr., Oceanport; Vasilios Alevizakos, Highland Park, both of N.J.

[73] Assignee: The United States of America as represented by the Secretary of the Army, Washington, D.C.

[21] Appl. No.: 976,799

[22] Filed: Nov. 16, 1992

[51] Int. Cl.5 .......................... G01S 5/02; G01R 23/16
[52] U.S. Cl. ........................................ 375/1; 342/417; 324/76.12; 324/76.19; 324/76.39
[58] Field of Search ................. 324/77 R, 77 B, 79 R; 342/110, 19, 417; 364/725, 726; 367/103; 375/1

[56] References Cited

U.S. PATENT DOCUMENTS

| | | | |
|---|---|---|---|
| 3,925,648 | 12/1975 | Speiser et al. | 364/725 |
| 3,942,035 | 3/1976 | Buss | 342/110 |
| 3,965,343 | 6/1976 | Speiser | 364/726 |
| 4,010,360 | 3/1977 | Alsup et al. | 364/726 |
| 4,100,498 | 7/1978 | Alsup et al. | 375/1 |
| 4,262,344 | 4/1981 | Gilmour | 367/103 |
| 4,280,203 | 7/1981 | Gilmouur | 367/103 |
| 4,282,579 | 8/1981 | Speiser et al. | 364/726 |
| 4,443,801 | 4/1984 | Klose et al. | 343/442 |
| 4,876,549 | 10/1989 | Masheff | 342/417 |
| 4,965,581 | 10/1990 | Skudera, Jr. et al. | 342/19 |
| 4,994,740 | 2/1991 | Skudera, Jr. et al. | 324/77 R |

Primary Examiner—Salvatore Cangialosi
Attorney, Agent, or Firm—Michael Zelenka; William H. Anderson

[57] ABSTRACT

The disclosed system measures the phase relationship of first and second BPSK signals received at a pair of receiving antennas. The antennas are connected to respective first and second converting circuits which convert the received signals into first and second CW signals. Each CW signal is subjected to chirp-Z processing so as to convert the first and second CW signals into first and second chirp-Z transforms, which are narrow pulses. Then, the phase relationship of the first and second narrow pulses is detected, so as to thereby detect the phase relationship of the first and second received BPSK signals. That phase information can be used, for example, to calculate the angle-of-arrival (AOA) of the received BPSK signals. Advantageously, each converting circuit includes a series connection of a frequency-doubling circuit, a bandpass filter, and a circuit for dividing frequency by two, in that order. A switching arrangement is provided which is operable for applying the outputs of the converting circuits to the phase detecting circuit only when the received signals are BPSK signals.

8 Claims, 2 Drawing Sheets

CIRCUIT FOR ACCURATELY MEASURING PHASE RELATIONSHIP OF BPSK SIGNALS

STATEMENT AS TO RIGHTS TO INVENTIONS MADE UNDER FEDERALLY-SPONSORED RESEARCH AND DEVELOPMENT

The invention described herein may be manufactured, used and licensed by or for the Government for Governmental purposes without payment to the inventors of any royalties.

BACKGROUND OF THE INVENTION

This invention relates to the field of COMINT-/ELINT (communications intelligence/electronic intelligence) signal processing, and more particularly to signal detection of low-level BPSK (binary phase shift keying) signals, and location of those signals by using a dual-channel chirp-Z interferometer processor to measure the phase relationship of signals received at a plurality of antennas.

A system of background interest is disclosed in U.S. Pat. No. 4,443,801 entitled, "Direction Finding and Frequency Identification Method and Apparatus" by D. Klose and W. Skudera, Jr. dated Apr. 17, 1984 ("the '801 patent"). The disclosures of this and all other prior art materials mentioned herein are expressly incorporated by reference. This patent describes a system wherein frequency and AOA measurements can be accurately obtained on primarily CW-type multiple-intercept signals by utilizing a dual channel chirp-Z processor. For convenience, a diagram showing relevant details of the '801 patent is given in FIG. 1.

A standard interferometer processor cannot do direction-finding (DF) on low-level BPSK signals because such signals have numerous phase changes that flip between zero and 180 degrees, which introduces measurement errors in the angle-of-arrival (AOA) and subsequent signal location. Another problem is that the chirp-Z transform of the BPSK signal is spread out with a small correlation peak and, therefore, is more difficult to detect when the input signal strength is of a low level.

SUMMARY OF THE INVENTION

Accordingly, a general object of the invention is to develop a circuit for accurately measuring the AOA of low-level BPSK signals.

A more specific object is for the circuit to automatically identify BPSK signals, and then convert them to a form in which their phase relationship and thereby the AOA can be effectively determined.

Another object is to improve the sensitivity of chirp-Z transform processing for BPSK signals.

These and other objects are accomplished by the disclosed system, which incorporates a dual-channel chirp-Z interferometer.

A particularly advantageous feature is the inclusion of a switching arrangement in each channel, for feeding a received BPSK signal to a circuit that converts the BPSK signal into a CW-type signal.

The present invention automatically detects whether the received signal is a BPSK signal, and then converts the BPSK signal into a CW signal that has no phase changes and whose chirp-Z correlation peak is the maximum time-bandwidth product of the subsystem. Thus, this automatic system results in an accurate angle-of-arrival (AOA) measurement with improved signal sensitivity.

Other features and advantages of the present invention will become apparent from the following description of the invention which refers to the accompanying drawings.

DETAILED DESCRIPTION OF THE INVENTION

Figure 1:
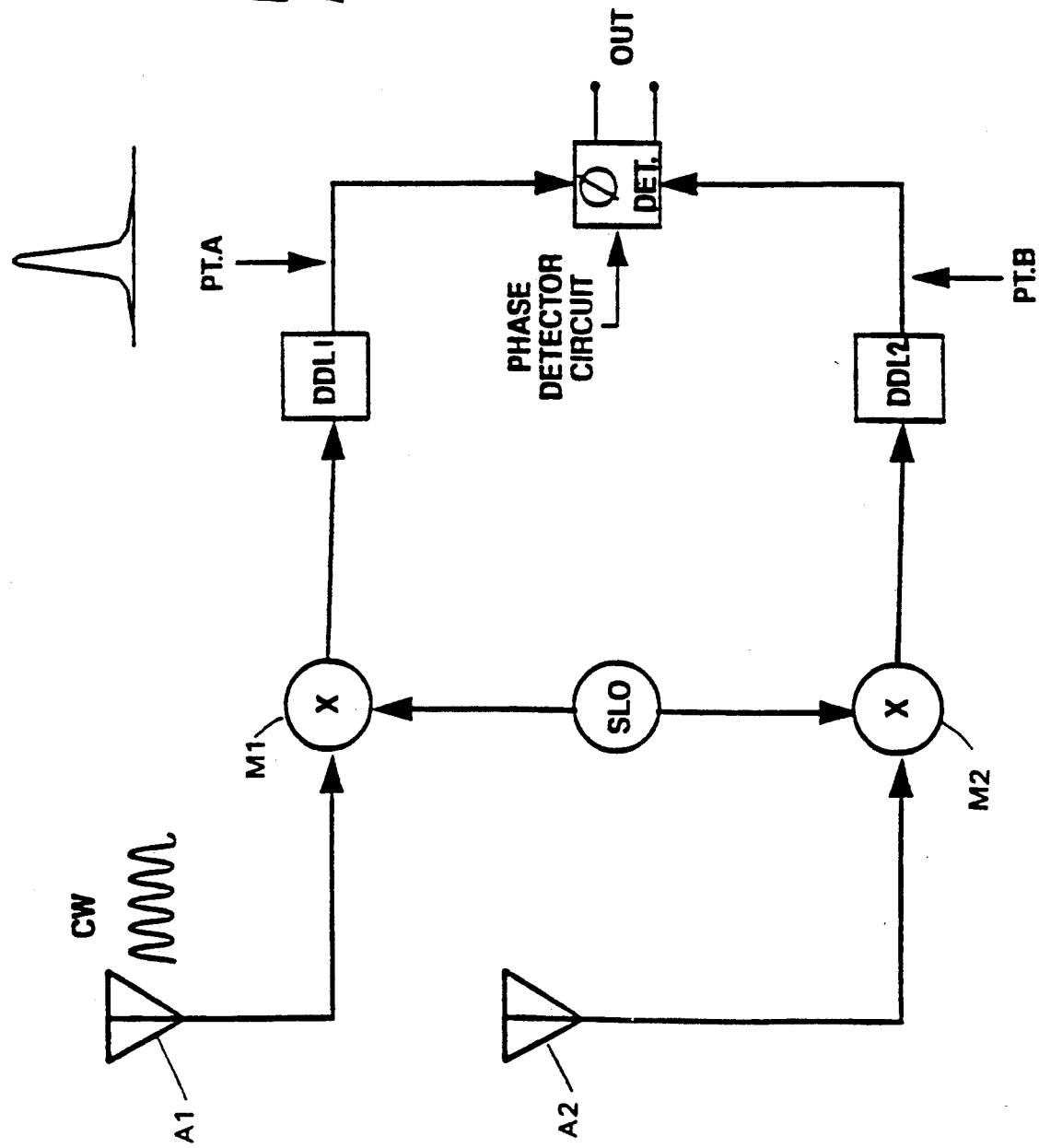
FIG. 1 is a block diagram of a conventional system according to the '801 patent.

In the known circuit of FIG. 1, respective input signals from two antennas A1 and A2 are combined in multipliers M1 and M2 with a sweep output signal from a sweeping local oscillator SLO. The SLO is a chirp-type SLO comprising an impulse generator which generates a series of impulse signals, and an expander which generates a series of ramp signals in response to the respective impulse signals. Each ramp signal begins shortly before the end of the previous ramp signal so as to provide the continuous sweep signal.

The multiplier outputs are passed through respective dispersive delay lines DDL1 and DDL2 whose output signals at points denoted A and B are provided to a phase detector circuit for determination of their phase, and from that, the desired angle-of-arrival. The circuit of FIG. 1 is effective essentially only with CW-type input signals.

Figure 2:
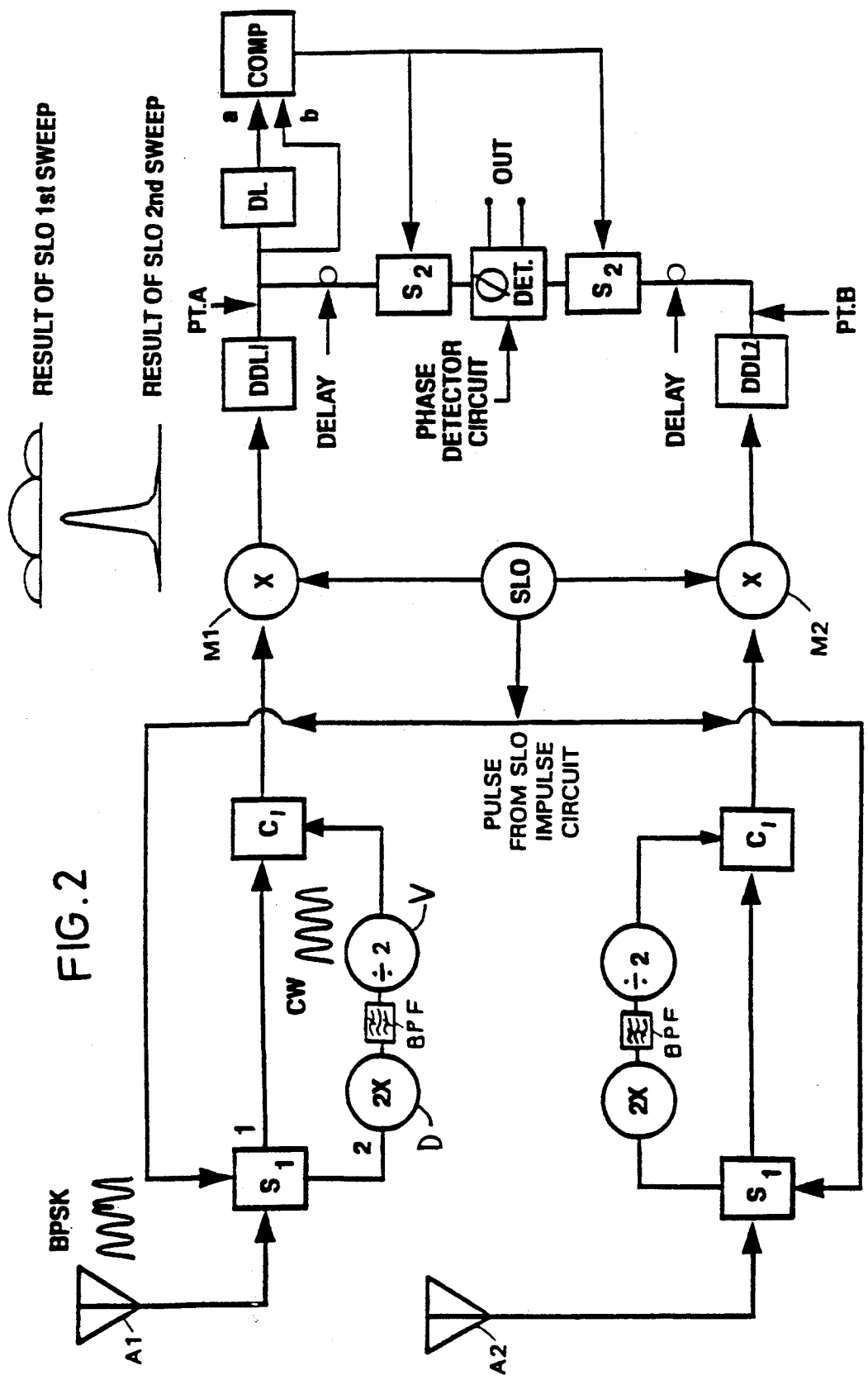
FIG. 2 is a block diagram of an embodiment of the present invention.

FIG. 2 shows an embodiment of the invention wherein a BPSK-type signal can be automatically identified and changed into a CW-type signal, along with high signal sensitivity detection, and wherein accurate AOA can be obtained.

The circuit of FIG. 2 improves upon that of FIG. 1 in several respects. In FIG. 2, instead of being passed directly to the multiplier M1 for being combined with the SLO signal, each received BPSK signal is fed to a pair of signal paths which are selected alternately by a switch S1. The switch S1 is controlled so as to switch between paths 1 and 2 in response to the pulse generated by the impulse circuit employed in the SLO.

Via path 1, the BPSK signal is passed directly to a coupler C1 which then passes the signal to the combiner M1 where it is combined with the SLO signal. Via path 2, on the other hand, the BPSK signal is converted into a CW-type signal before being received by the coupler C1.

More specifically, in path 2, the BPSK signal is first processed by a frequency doubler D. The output of the doubler D is applied to a bandpass filter BPF. As is well known, the doubler effectively squares the signal (see Table 1, eq. 3) and the bandpass filter removes excess harmonics from the squared signal. The output of the bandpass filter is then processed by a frequency divider V, which divides its frequency by 2.

The SLO impulse controls the switch S1 so that the signal is fed to paths 1 and 2 during alternate sweeps of the SLO output. For every second sweep of the SLO the signal is applied to the circuit of path 2, which according to the equations in Table 1, "strips off" the phase of the signal and, therefore, turns it into a CW-type signal. Once the signal is represented as a CW signal, then accurate AOA can be obtained as in the system depicted in the '801 patent and FIG. 1, with the same high signal sensitivity that can be obtained for detection of CW signals with the chirp-Z circuit.

In more detail, the operation of FIG. 2 is as follows. The sweeping local oscillator (SLO) has a sweep time that is much faster (typically microseconds) than the duration of the BPSK input signal (typically milliseconds). The output of the SLO sweeps continuously when provided with an appropriate impulse signal, with each sweep immediately following the next, generating a chirp signal.

Initially the switches S1 are set so that the signal paths from antennas A1 and A2 go directly to the couplers C1, then on to the mixers M1 and M2. After combining with the SLO output in the mixers M1 and M2, the signals are passed to the dispersive delay lines DDL and DDL2, whose output at point "A" is shown as a spreadout pulse (see "RESULT OF SLO 1ST SWEEP" in FIG. 2). Thus far, the operation corresponds with that of FIG. 1.

For convenience, only the envelope of a detected signal is shown. In fact, the signal is bipolar and the phase difference between point "A" and point "B" is retained inside the signal. As explained in the '801 patent, the phase difference between points A and B is measured by applying those signals directly to a phase detector circuit.

However, it is not desirable to apply CW-type signals to the phase detector circuit because the output will be meaningless. It is desirable to only apply BPSK signals to the phase detector. Therefore, in the circuit of FIG. 2 a pair of switches S2 control whether or not the signals from A and B are applied to the phase detector circuit. In turn, a comparator circuit COMP controls the switches S2. The signal at point A is delayed by a delay line DL for a time corresponding to a sweep period and is applied to the comparator as an input "a". The undelayed signal from point A is applied to the comparator as an input "b". The comparator circuit outputs a signal to toggle the switches S2 only when the inputs "a" and "b" are different.

Thus, when the input to the antenna is a CW-type signal, the comparator COMP will not provide an output signal to toggle the switches S2 "on" and thereby provide signals to the phase detector, because in that case the signals "a" and "b" will be the same.

The operation of the comparator is illustrated in Table 2. When the antenna input is a BPSK-type signal, alternating wide and narrow pulses will appear at point A, as illustrated at the top of FIG. 2. At the time of the first SLO pulse, S1 is switched to path 1, a wide pulse is detected, and that signal is provided to S2. S2 was initially set "on." However, at this time S2 is toggled "off" by the output of the comparator, since "a" and "b" are not equal. A small delay is inserted before S2 to insure that COMP will switch S2 before the wide pulse gets there. Thus, there is no phase output.

The same operation occurs at point "B," so again, the phase detector circuit does not receive, and therefore does not output any phase information for, the wide pulse at point B.

However, at the time of the second SLO pulse, when S1 is switched to pass the input signal into path 2 during the next SLO period, the signal at point "A" (as well as at point "B") becomes a narrow pulse which is similar to a CW signal. When this is fed to the comparator COMP, the comparator again issues an output, because "a" and "b" are again different, and the switches S2 are turned "on" before the compressed signal gets to S2.

Thus, the phase detector outputs phase information only on signals that have been processed by the circuit in path 2 and therefore no longer contain any phase modulation, and thus, an accurate phase difference measurement can be made between the signals received by the two antennas A1 and A2, as is done in the circuit in FIG. 1.

It is to be noted that any time error between the time of the DDL outputs and the time that the SLO impulse is applied to S1 can be easily adjusted via delay lines or counter-controlled circuits.

Table 2 below shows the overall timing pattern which places switches S1 and S2 in the proper positions such that an angle-of-arrival (AOA) measurement is made only when the BPSK input signal is stripped of any phase modulation, and appears as a narrow pulse.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

TABLE 1

METHOD FOR STRIPPING PHASE CHANGES FROM A BPSK SIGNAL $$V_{Bpsk}(t) = \sum_{n=1}^{N} A(t)[COS(Wot_n + \theta n)] \quad (1)$$ Standard BPSK equation Where: N is the number of phase changes
$\theta n = 0/180$ degrees $= W_c t_n$
$A(t) = 1$ $$V_{Bpsk}(t) = \sum_{n=1}^{N} COS(Wot_n) COS(Wct_n) \quad (2)$$ Simplified BPSK equation Where: Wo is the carrier frequency
Wc is the chip frequency
K is a constant Now, for simplicity considering only one term in the above summation:

$$V_{BPSK}^2(t) = K + \frac{V_{Bpsk}}{2}(2t)$$

$$= \frac{1}{2}[COS(2Wot)COS(2Wct)] + K$$

$$= [COS^2(Wot) - SIN^2(Wot)][COS^2(Wct) - SIN^2(Wct)]\frac{1}{2} + K$$

$$V_{BPSK}^2(t) - K \approx COS^2(Wot) - SIN^2(Wot) \quad (3)$$ equation after (2x) and bandpass filter (BPF)
$$= COS(2Wot)$$

Since:
$COS(180) = -1, COS(0) = 1, SIN(180) = 0,$ and $SIN(0) = 0$ $Vcw(t) = COS(Wot)$ (4) equation after division by 2, i.e., a CW signal

TABLE 2

| SLO Pulse No. | Input Path via S1 | Pt. A/B Pulse Width | Pulse width at a, b | COMP Output Pulse? | S2 goes | Phase Output ? |
|---|---|---|---|---|---|---|
| 1 | 1 | wide | none, wide | yes | off | no |
| 2 | 2 | narrow | wide, narrow | yes | on | yes |
| 3 | 1 | wide | narrow, wide | yes | off | no |
| 4 | 2 | narrow | wide, narrow | yes | on | yes |
| 5 | 1 | wide | narrow, wide | yes | off | no |
| 6 | 2 | narrow | wide, narrow | yes | on | yes |
| 7 | 1 | wide | narrow, wide | yes | off | no |
| 8 | 2 | narrow | wide, narrow | yes | on | yes |

What is claimed is:

1. A system for measuring the phase relationship of first and second BPSK signals received at a pair of receiving antennas, comprising:

first and second converting means which are operable for converting BPSK signals into CW signals, for receiving said received signals and outputting first and second CW signals;

first and second chirp-Z processing means for receiving and processing said first and second CW signals and outputting first and second chirp-Z transforms; and phase detecting means for detecting the phase relationship of said first and second chirp-Z transforms and thereby detecting the phase relationship of said first and second received BPSK signals.

2. A system as in claim 1, wherein each said converting means comprises a series connection of frequency-doubling means, bandpass-filtering means, and frequency-halving means, in that order.

3. A system as in claim 1, further comprising BPSK detecting means for detecting whether said received signals are BPSK signals, and switching means controlled by said BPSK detecting means for applying said chirp-Z transforms to said phase detecting means only when said received signals are BPSK signals which have been converted into CW signals by said converting means.

4. A system as in claim 3, wherein said BPSK detecting means comprises an input switch which alternately applies said received signal and said first CW signal to said first chirp-Z processing means, so that when said received signal is a BPSK signal, the output of said first chirp-Z processing means alternates between a wide signal, which is a transform of the BPSK received signal, and a narrow signal, which is a transform of the first CW signal;

and wherein said BPSK detecting means detects whether the output of said first chirp-Z processing means contains such alternating wide and narrow signals, and if so, controls said switching means so as to apply said chirp-Z transforms of said first and second CW signals to said phase detecting circuit.

5. A method of measuring the phase relationship of first and second BPSK signals received at a pair of receiving antennas, comprising the steps of:

receiving and converting said BPSK signals into first and second CW signals;

chirp-Z processing said first and second CW signals so as to produce first and second chirp-Z transforms; and detecting the phase relationship of said first and second chirp-Z transforms and thereby detecting the phase relationship of said first and second received BPSK signals.

6. A method as in claim 5, wherein said BPSK signals are converted into CW signals by providing them to a series connection of a frequency-doubling circuit, a bandpass filter, and a frequency-halving circuit, in that order.

7. A method as in claim 5, further comprising the steps of detecting whether said received signals are BPSK signals, and selectively detecting the phase relationship of said chirp-Z transforms only when said received signals are BPSK signals which have been converted into CW signals by said converting means.

8. A method as in claim 7, wherein said detecting step is performed by alternately applying said received signal and said first CW signal to said first chirp-Z processing circuit, so that when said received signal is a BPSK signal, the output of said first chirp-Z processing means alternates between a wide signal, which is a transform of the BPSK received signal, and a narrow signal, which is a transform of the first CW signal; and detecting whether the output of said first chirp-Z processing means contains such alternating wide and narrow signals, and if so, applying said chirp-Z transforms of said first and second CW signals to said phase detecting circuit.

* * * * *